United States Patent
Han et al.

(10) Patent No.: US 7,091,074 B2
(45) Date of Patent: Aug. 15, 2006

(54) METHOD OF FORMING A GATE OXIDE LAYER IN A SEMICONDUCTOR DEVICE AND METHOD OF FORMING A GATE ELECTRODE HAVING THE SAME

(75) Inventors: Jae-Jong Han, Seoul (KR); Woo-Sung Lee, Yongin-si (KR); Sang-Jin Park, Sungnam-si (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/878,103

(22) Filed: Jun. 28, 2004

(65) Prior Publication Data

US 2005/0003597 A1    Jan. 6, 2005

(30) Foreign Application Priority Data

Jul. 5, 2003     (KR)     ................ 10-2003-0045488

(51) Int. Cl.
*H01L 21/336*     (2006.01)
*H01L 21/8234*    (2006.01)

(52) U.S. Cl. ................... 438/197; 438/275; 438/745

(58) Field of Classification Search ............... 438/197, 438/216, 217, 275, 287, 745, 746, 753
See application file for complete search history.

(56) References Cited

U.S. PATENT DOCUMENTS

| | | | |
|---|---|---|---|
| 5,683,920 A | * | 11/1997 | Lee ............................ 438/232 |
| 5,989,948 A | * | 11/1999 | Vines et al. ................ 438/216 |
| 6,124,171 A | | 9/2000 | Arghavani et al. ......... 438/286 |

* cited by examiner

*Primary Examiner*—Phuc T. Dang
(74) *Attorney, Agent, or Firm*—F. Chau & Associates LLC

(57) ABSTRACT

A first gate oxide layer pattern having a first thickness is formed in a first region of a substrate and a second gate oxide layer having a second thickness is formed in a second region of a substrate. A surface of the second gate oxide layer is selectively nitrified to form an oxynitride layer, thereby reducing a depletion effect of a poly gate and a fluctuation of threshold voltage.

21 Claims, 12 Drawing Sheets

METHOD OF FORMING A GATE OXIDE LAYER IN A SEMICONDUCTOR DEVICE AND METHOD OF FORMING A GATE ELECTRODE HAVING THE SAME

CROSS REFERENCE TO RELATED APPLICATION

This application claims priority under 35 USC § 119 to Korean Patent Application No. 2003-45488, filed on Jul. 5, 2003, the contents of which are herein incorporated by reference in their entirety.

BACKGROUND OF THE INVENTION

1. Technical Field

The present disclosure relates to a method of forming a gate oxide layer and a method of forming a gate electrode having the same. More particularly, the present disclosure relates to a method of forming a gate oxide layer that includes an oxynitride layer that is formed using a nitride layer pattern as an etching mask and a method of forming a gate electrode having the gate oxide layer.

2. Discussion of the Related Art

A semiconductor memory device is classified into a random access memory (RAM) device and a read only memory (ROM) device. The RAM device such as a dynamic random access memory (DRAM) device and a static random access memory (SRAM) device is a volatile memory device. Data is exhausted from the volatile memory device with the lapse of time. Data is, however, rapidly inputted/outputted into/from the volatile memory device. On the contrary, when data is inputted into the ROM device, the data is constantly maintained in the ROM device. Data is, however, slowly inputted/outputted into/from the ROM device.

Further, to meet consumer demand, a system-on-chip device has been manufactured. The system-on-chip device has a single chip in which various semiconductor devices are integrated. For example, the system-on-chip device includes a merged DRAM and logic (MDL) device in which a DRAM region and a logic region are merged, or a merged flash and logic (MFL) device in which a flash memory region and a logic region are merged.

Particularly, the MDL device may have a compact size, a low power consumption, a rapid operation speed, a high efficiency and low electromagnetic interference noise since the DRAM region and the logic region are merged in the single chip. A scale of a semiconductor device in the MDL device is greatly reduced such that a short channel effect is frequently generated in a deep-submicron metal oxide semiconductor (MOS) transistor. To suppress the short channel effect, a dual gate electrode having a surface channel structure and a low threshold voltage is used.

Since a high voltage is applied to the DRAM device, a gate oxide layer having a relatively thick thickness may be employed in the DRAM device. On the contrary, since the logic device operates rapidly, a gate oxide layer having a relatively thin thickness may be employed in the logic device. Accordingly, to manufacture a semiconductor device that operates rapidly with application of a high voltage, the dual gate structure that includes a gate oxide layer having different thicknesses should be employed in the semiconductor device.

In a known method of forming a gate oxide layer having different thicknesses, a silicon nitride layer is formed on a substrate having a first gate oxide layer. The gate oxide layer is etched using the silicon nitride layer as an etching mask to expose a surface of the substrate. A second gate oxide layer is formed on the exposed surface of the substrate.

In a gate electrode including a dual gate oxide layer, a gate oxide layer in a P-type metal oxide semiconductor (P-MOS) transistor of a substrate has a thickness of below about 50 Å. A P-type impurity such as boron (B) or boron trifluoride ($BF_3$) is implanted into a silicon layer. The silicon layer is annealed to form a polysilicon layer.

However, the P-type impurity may infiltrate into a channel region through the gate oxide layer having a thickness of below about 50 Å so that a depletion effect of a poly gate and a fluctuation of a threshold voltage may occur in the gate electrode.

As a result, it is difficult to control the threshold voltage of the gate electrode, thereby deteriorating the characteristics of the P-MOS transistor. Particularly, the threshold voltage fluctuation is generated from penetrating boron into the channel region of the P-MOS transistor.

FIGS. 1A to 1F are cross-sectional views illustrating a conventional method of forming a dual gate electrode including a dual gate oxide layer. In FIGS. 1A to 1F, a first region 'A' represents an N-type metal oxide semiconductor (N-MOS) transistor region and a second region 'B' represents a P-MOS transistor region.

Referring to FIGS. 1A and 1B, a shallow trench isolation (STI) structure 8 is formed at an upper portion of a substrate 10 to divide the substrate 10 into the first and second regions A and B. The substrate 10 is thermally oxidized to form a first gate oxide layer 12 on the substrate 10. A nitride layer 14 is formed on the first oxide layer 12.

A photoresist pattern 16 is formed on the nitride layer 14 in the first region A. The nitride layer 14 is etched using the photoresist pattern 16 as an etching mask to form a nitride layer pattern 14a positioned in the first region A.

Referring to FIGS. 1C and 1D, the first gate oxide layer 12 is etched using the nitride layer pattern 14a as an etching mask to form a first gate oxide layer pattern 12a positioned in the first region A.

The photoresist pattern 16 is then removed by an ashing process and a stripping process.

A second gate oxide layer 18 is formed in the second region B. For example, the second gate oxide layer 18 is formed via a thermal oxidation process or a local oxidation of silicon (LOCOS) process. The second gate oxide layer 18 has a thickness of about 50 Å. The nitride pattern 14a is then removed by a wet etching process.

Referring to FIGS. 1E and 1F, an oxynitride layer 20 having a predetermined thickness is formed on the first gate oxide layer pattern 12a and the second gate oxide layer 18. A polysilicon layer 22 is then formed on the oxynitride layer 20.

The polysilicon layer 22, the oxynitride layer 20 and the gate oxide layers 12a and 18 are subsequently etched using an etching mask (not shown) to form a first gate electrode 30a in the first region A and a second gate electrode 30b in the second region B. Here, the first gate electrode 30a includes a first gate oxide layer pattern 12b, an oxynitride layer pattern 20a formed on the first gate oxide layer pattern 12b, and a polysilicon layer pattern 22a formed on the oxynitride layer pattern 20a. The second gate electrode 30b includes a second gate oxide layer pattern 18a, an oxynitride layer pattern 20a formed on the second gate oxide layer pattern 18a, and a polysilicon layer pattern 22a formed on the oxynitride layer pattern 20a.

As described above, the first gate electrode 30a includes the oxynitride layer pattern 20a. Nitrogen having positive charge increases in the first gate electrode 30a due to the oxynitride layer pattern 20a so that a threshold voltage of an N-MOS transistor may be reduced.

To prevent the reduction of the threshold voltage, boron ions are additionally implanted into a channel region after the first gate oxide layer 12 is formed. However, a static refresh property of a transistor may be deteriorated in proportion to an amount of the implanted boron ions, thereby slowing the operation of a semiconductor device.

SUMMARY OF THE INVENTION

An embodiment of the present invention provides a method of forming gate oxide layers, wherein a surface of a relatively thin gate oxide layer is selectively nitrified.

An embodiment of the present invention provides a method of forming a gate electrode, wherein a surface of a relatively thin gate oxide layer is selectively nitrified.

In a method of forming gate oxide layers of a semiconductor device, in accordance with an embodiment of the present invention, a first gate oxide layer having a first thickness is formed on a substrate. A nitride layer pattern is formed on the first gate oxide layer. The nitride layer pattern may have a dense structure and define a region for forming a first gate oxide layer pattern on the first gate oxide layer. The first gate oxide layer is etched using the nitride layer pattern as an etching mask to form the first gate oxide layer pattern that partially exposes a surface of the substrate. A second gate oxide layer having a second thickness is formed on the exposed surface of the substrate. A surface of the second gate oxide layer is nitrified to form an oxynitride layer on the second gate oxide layer.

In a method of forming a gate electrode of a semiconductor device, in accordance with an embodiment of the present invention, a first gate oxide layer having a first thickness is formed on a substrate that is divided into first and second regions. A nitride layer pattern is formed on the first gate oxide layer in the first region. The nitride layer pattern may have a dense structure. The first gate oxide layer is etched using the nitride layer pattern as an etching mask to form a first gate oxide layer pattern in the first region. A second gate oxide layer having a second thickness less than the first thickness is formed on the second region. A surface of the second gate oxide layer is nitrified to form an oxynitride layer on the second gate oxide layer. A polysilicon layer is formed on the first gate oxide layer pattern and the oxynitride layer. The first gate oxide layer pattern, the second gate oxide layer, the oxynitride layer and the polysilicon layer are etched to form a first gate electrode in the first region and a second gate electrode in the second region.

The first region may include one of an N-type metal oxide semiconductor (N-MOS) transistor region, a high voltage (HV) region or a dynamic random access memory (DRAM) device region of a merged DRAM & logic (MDL) device. The second region may include one of a P-type metal oxide semiconductor (P-MOS) transistor region, a low voltage (LV) region, or a logic region of an MDL device. The first gate oxide pattern may be located in the first region and have the first thickness greater than the second thickness of the second gate oxide layer located in the second region. Forming the nitride layer pattern may comprise annealing the first gate oxide layer, forming a nitride layer on the annealed first gate oxide layer, annealing the nitride layer, forming a photoresist pattern on the annealed nitride layer, and etching the annealed nitride layer using the photoresist pattern as an etching mask to form the nitride layer pattern. The annealing processes densify the oxynitride layer. The nitride layer may be formed at a temperature of below about 600° C. by a low pressure chemical vapor deposition process. The first gate oxide layer and the nitride layer may be annealed at a temperature of about 730° C. to about 950° C. under an inactive gas atmosphere.

The surface of the second gate oxide layer is nitrified to form the oxynitride layer. The oxynitride layer may be formed by implanting at least one of ions of nitrogen or radicals of ammonia into the surface of the second gate oxide layer after the substrate including the second gate oxide layer is heated to a temperature of about 380° C. to about 450° C. The nitride layer pattern may be removed using an etchant having a high selectivity with respect to the oxynitride layer after forming the oxynitride layer.

First impurities may be implanted into the polysilicon layer in the first region, and second impurities may be implanted into the polysilicon layer in the second region. A first source/drain region and a second source/drain region may be formed by implanting ions into a surface of the substrate having the first and second gate electrodes.

A semiconductor device, in accordance with an embodiment of the present invention, comprises a substrate divided into a first region and a second region, a first gate electrode formed in the first region, wherein the first gate electrode comprises a first gate oxide layer pattern and a first polysilicon layer pattern formed on the first gate oxide layer pattern, and a second gate electrode formed in the second region, wherein the second gate electrode comprises a second gate oxide layer pattern, an oxynitride layer pattern formed on the second gate oxide layer pattern, and a second polysilicon layer pattern formed on the oxynitride layer pattern. A thickness of the first gate oxide layer pattern is greater than a thickness of the second gate oxide layer pattern.

According to an embodiment of the present invention, since the oxynitride layer is selectively formed on the second gate oxide layer having the second thickness, ions implanted into the polysilicon layer do not flow through the second gate oxide layer to a channel region. Further, since the oxynitride layer is not formed on the first gate oxide layer having the first thickness, an additional ion implantation process, which is performed on the channel region for increasing a threshold voltage of a semiconductor device, is not needed.

BRIEF DESCRIPTION OF THE DRAWINGS

Preferred embodiments of the invention can be understood in more detail from the following descriptions taken in conjunction with the accompanying drawings in which.

DETAILED DESCRIPTION OF THE PREFERRED EMBODIMENTS

Preferred embodiments of the present invention now will be described more fully hereinafter with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art.

FIGS. 2A to 2G are cross-sectional views illustrating a method of forming gate electrodes including gate oxide layers in accordance with an embodiment of the present invention.

Figure 1A:
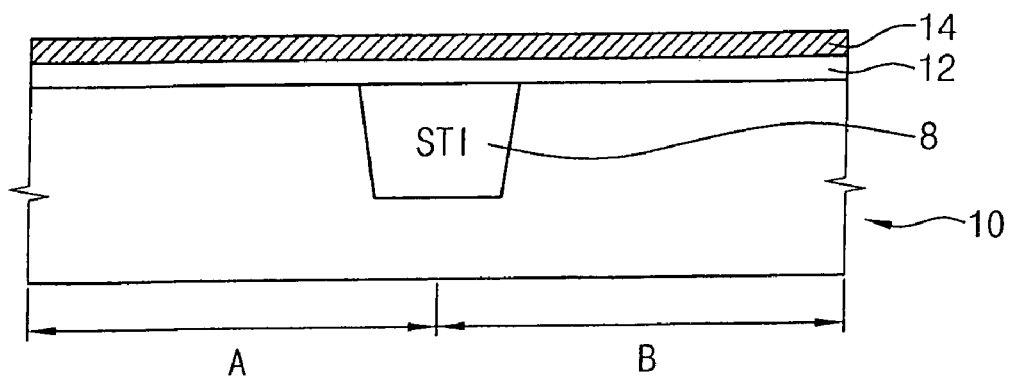
FIGS. 1A to 1F are cross-sectional views illustrating a conventional method of forming gate electrodes including respective gate oxide layers.
Figure 1B:
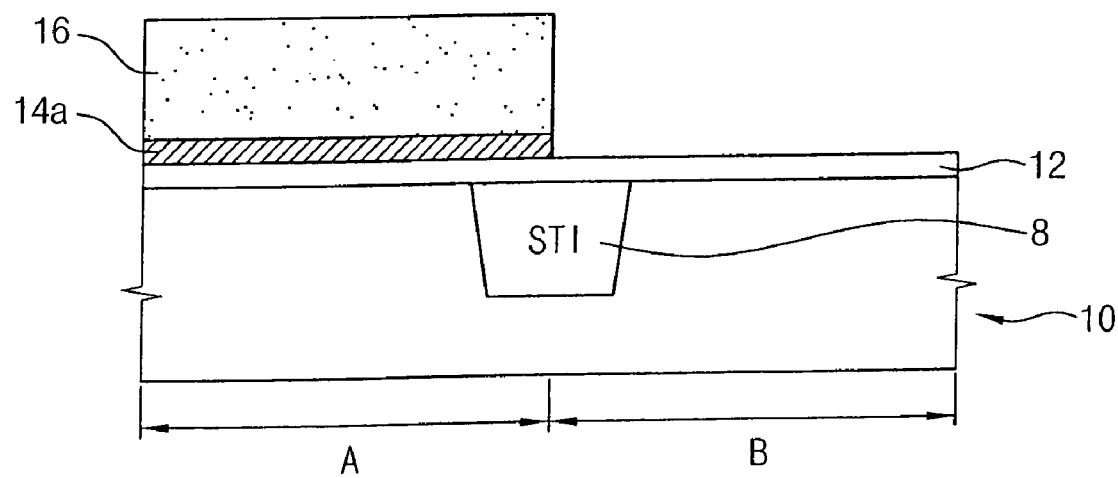
Figure 1C:
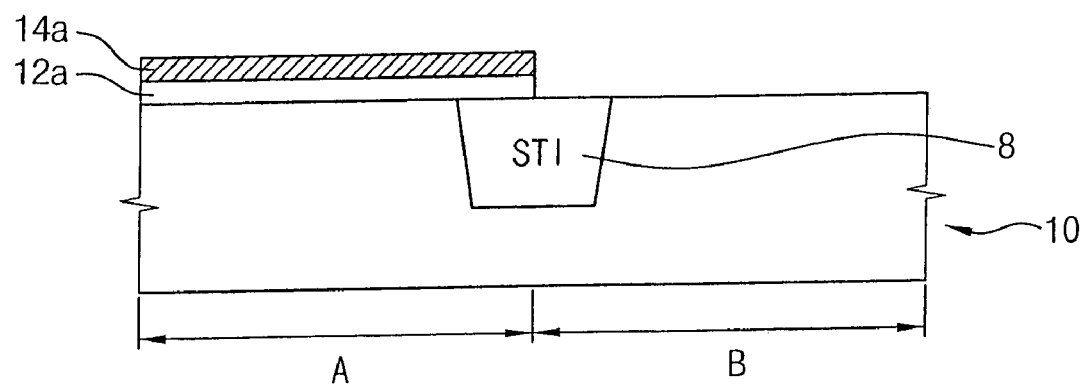
Figure 1D:
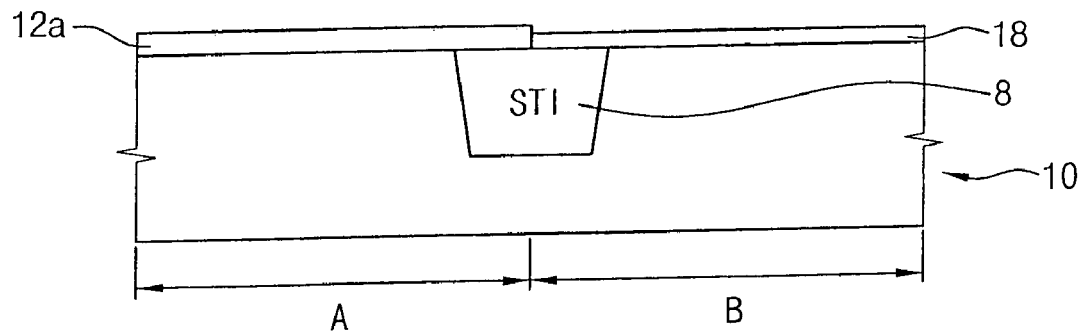
Figure 1E:
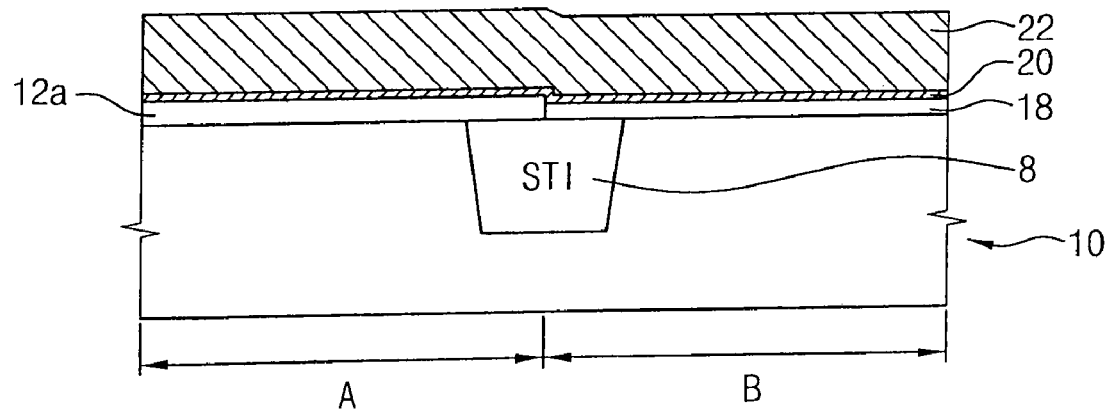
Figure 1F:
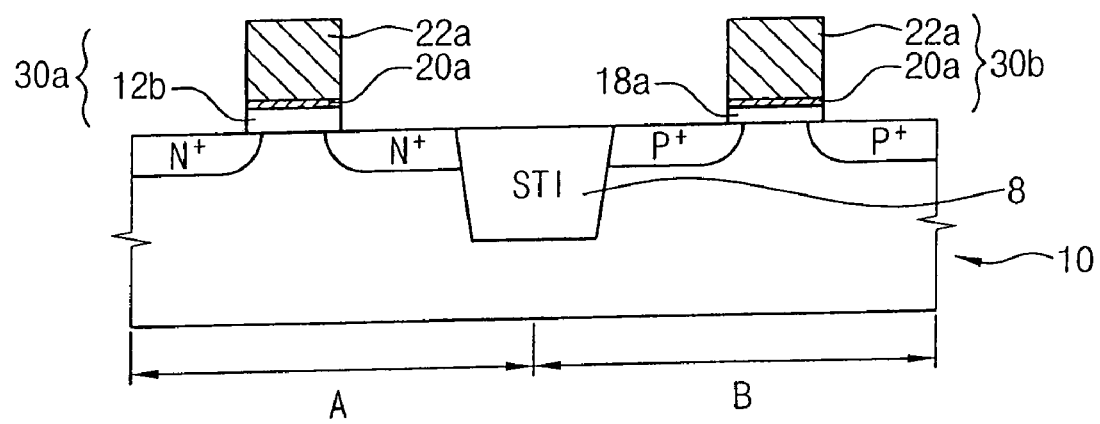
Figure 2A:
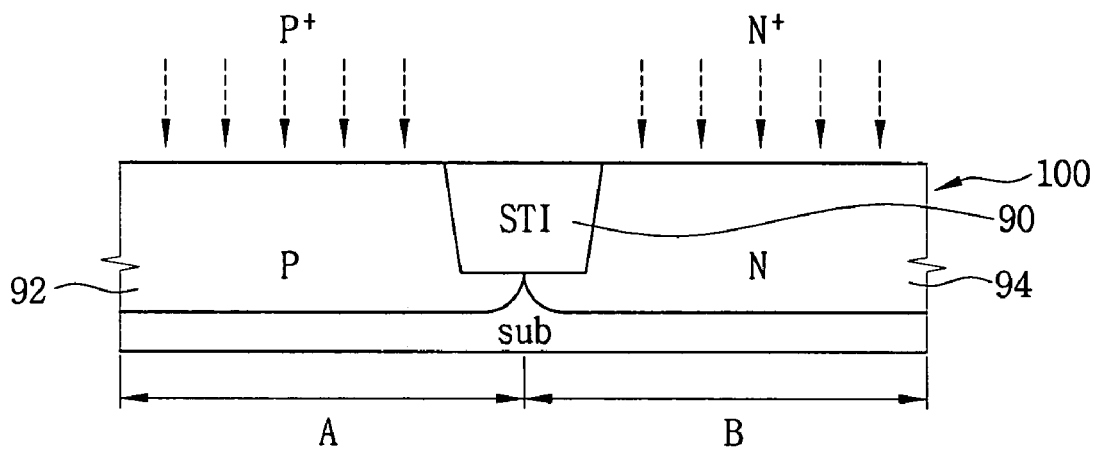
FIGS. 2A to 2G are cross-sectional views illustrating a method of forming gate electrodes including gate oxide layers in accordance with an embodiment of the present invention.

Referring to FIG. 2A, isolation layer patterns 90 are formed on a semiconductor substrate 100 by an isolation process so as to divide the semiconductor substrate 100 into a plurality of regions. That is, the semiconductor substrate 100 is divided into a plurality of regions including a first region A and a second region B in accordance with is the isolation layer patterns 90. Here, the isolation layer patterns 90 may be formed via a shallow trench isolation (STI) process.

The first region A may correspond to an N-type metal oxide semiconductor (N-MOS) transistor region, a high voltage (HV) region or a dynamic random access memory (DRAM) device region of a merged DRAM & logic (MDL) device. The second region B may correspond to a P-type metal oxide semiconductor (P-MOS) transistor region, a low voltage (LV) region, or a logic region of an MDL device.

After a sacrificial oxide layer (not shown) is formed on the semiconductor substrate 100 including the isolation layer patterns 90, a P-type well 92 is formed in the first region A by implanting $P^+$ type impurities into the first region A, whereas an N-type well 94 is formed in the second region B by implanting $N^+$ type impurities into the second region B.

Figure 2B:
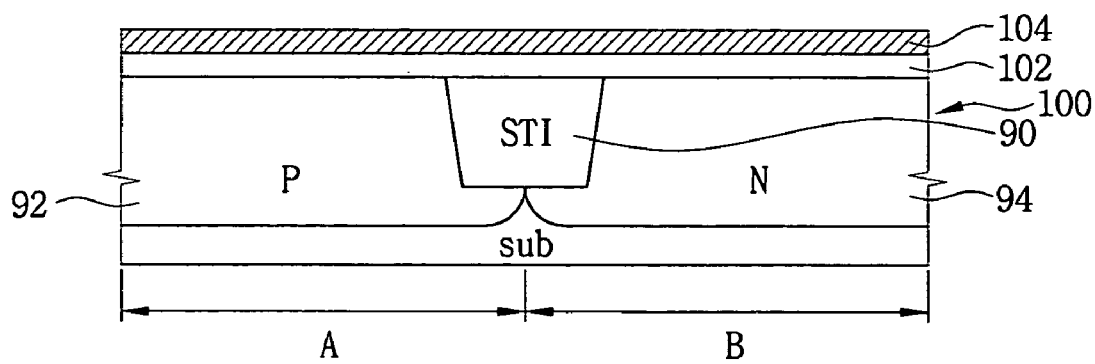

As shown in FIG. 2B, after removing the sacrificial oxide layer from the substrate 100, a first gate oxide layer 102 is formed on the substrate 100. The first gate oxide layer has a thickness of about 60 Å to about 80 Å. The first gate oxide layer 102 is formed via a thermal oxidation process or a local oxidation of silicon (LOCOS) process.

A nitride layer 104 is formed on the first gate oxide layer 102 to have a thickness of about 60 Å to about 80 Å. When the nitride layer 104 is formed by a low pressure chemical vapor deposition (LPCVD) process at a temperature of below about 600° C., annealing processes may be performed in order to densify the nitride layer 104 before and after forming the nitride layer 104 on the first gate oxide layer 102.

Before forming the nitride layer 104, the first gate oxide layer 102 is annealed at a temperature of about 730° C. to about 950° C. under an inactive (or inert) gas atmosphere in a primary annealing process. After forming the nitride layer 104, the nitride layer 104 is annealed at a temperature of about 730° C. to about 950° C. under an inactive (or inert) gas atmosphere in a secondary annealing process.

By performing the primary and secondary annealing processes, nitrogen does not penetrate into the first gate oxide layer 102 in the first region A when a surface of a second gate oxide layer 108 is selectively nitrified in a subsequent process.

Figure 2C:
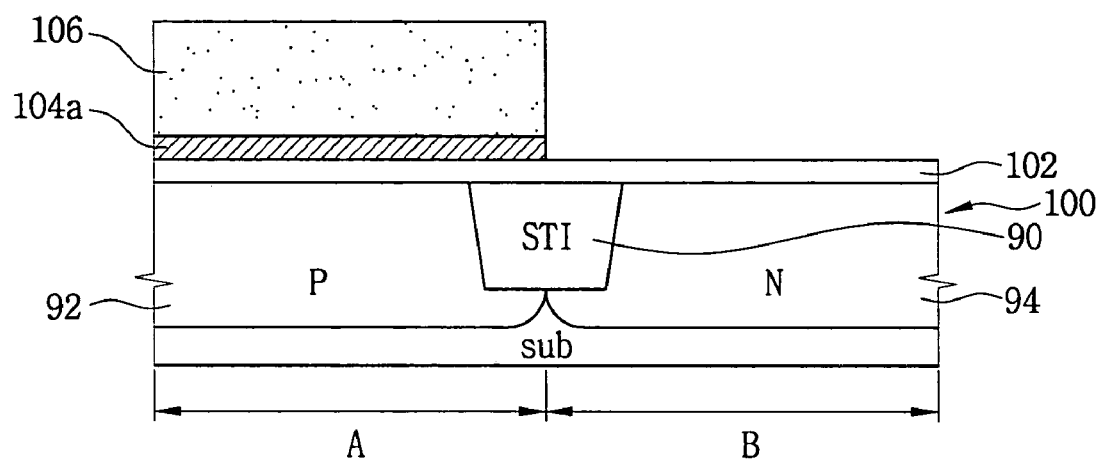

Referring to FIG. 2C, a photoresist film (not shown) is formed on the annealed nitride layer 104. The photoresist film is exposed and developed to form a photoresist pattern 106 in the first region A.

A portion of the nitride layer 104 is etched using the photoresist pattern 106 as an etching mask to thereby form a nitride pattern 104a in the first region A.

Figure 2D:
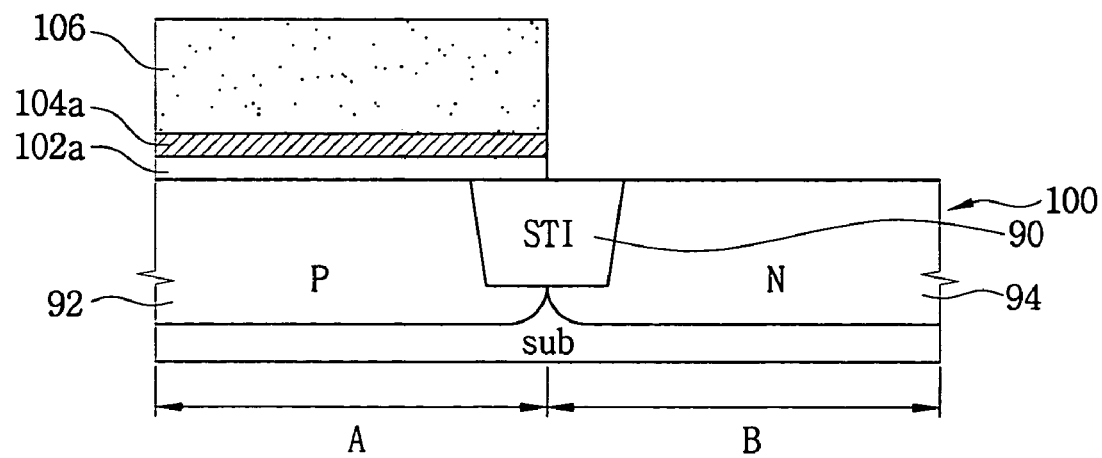
Figure 2E:
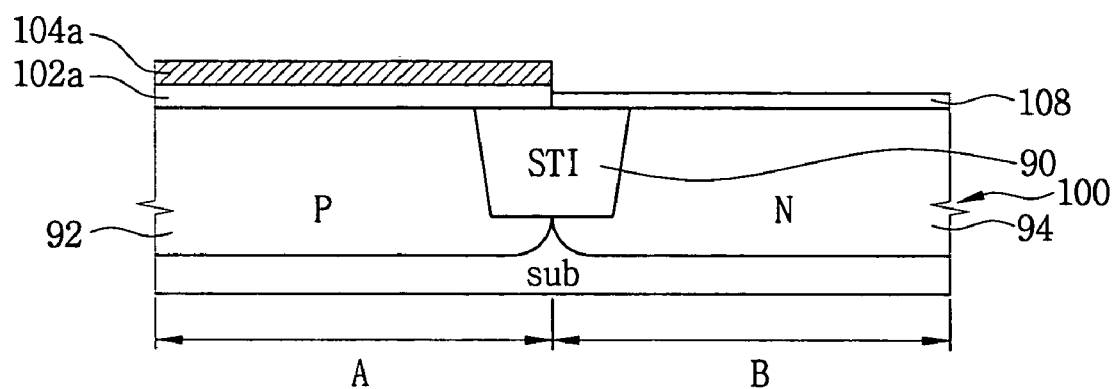

Referring to FIGS. 2D and 2E, the first gate oxide layer 102 is selectively etched using the nitride pattern 104a and the photoresist pattern 106 as etching masks, thereby forming a first gate oxide layer pattern 102a in the first region A. The first gate oxide layer pattern 102a is formed by a wet etching process.

After the photoresist pattern 106 is removed by ashing and stripping processes, a second gate oxide layer 108 is formed on the second region B. The second gate oxide layer 108 is formed via a thermal oxidation process or a LOCOS process. The second gate oxide layer 108 has a thickness of about 40 Å to about 50 Å.

Figure 3:
FIG. 3 is a picture showing a profile of an oxide layer in an active region after forming gate oxide layers in accordance with an embodiment of the present invention.

As shown in FIG. 3, when a gate oxide layer including the first gate oxide layer pattern 102a and the second gate oxide layer 108 are formed on the substrate 100, the gate oxide layer has a profile substantially identical to that of a gate oxide layer having a single layer without an increase in a thickness of the gate oxide layer.

Figure 2F:
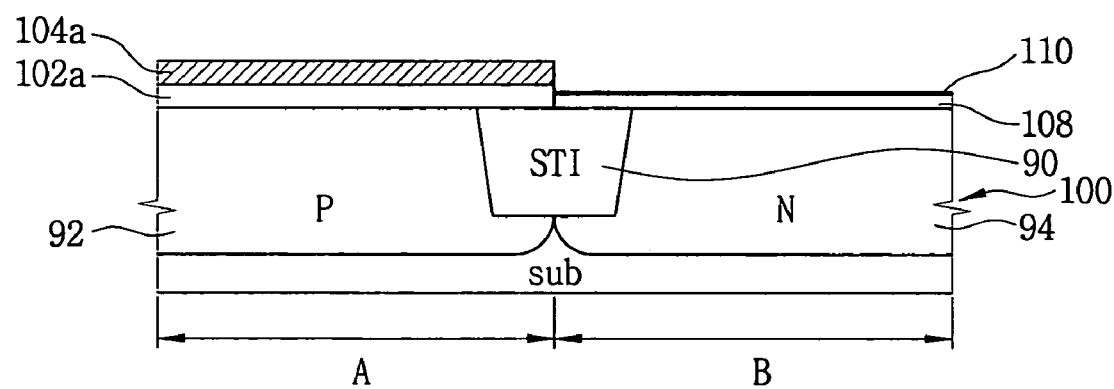

Referring to FIG. 2F, a surface of the second gate oxide layer 108 is nitrified to form an oxynitride layer 110. Particularly, the substrate having the second gate oxide layer 108 is heated to a temperature of about 380° C. to about 450° C. Ions and radicals of nitrogen ($N_2$) or ammonia ($NH_3$) are then implanted into the surface of the second gate oxide layer 108 to form the oxynitride layer 110. That is, the surface of the second gate oxide layer 108 is transformed into the oxynitride layer 110 by the implantation of nitrogen.

Figure 4:
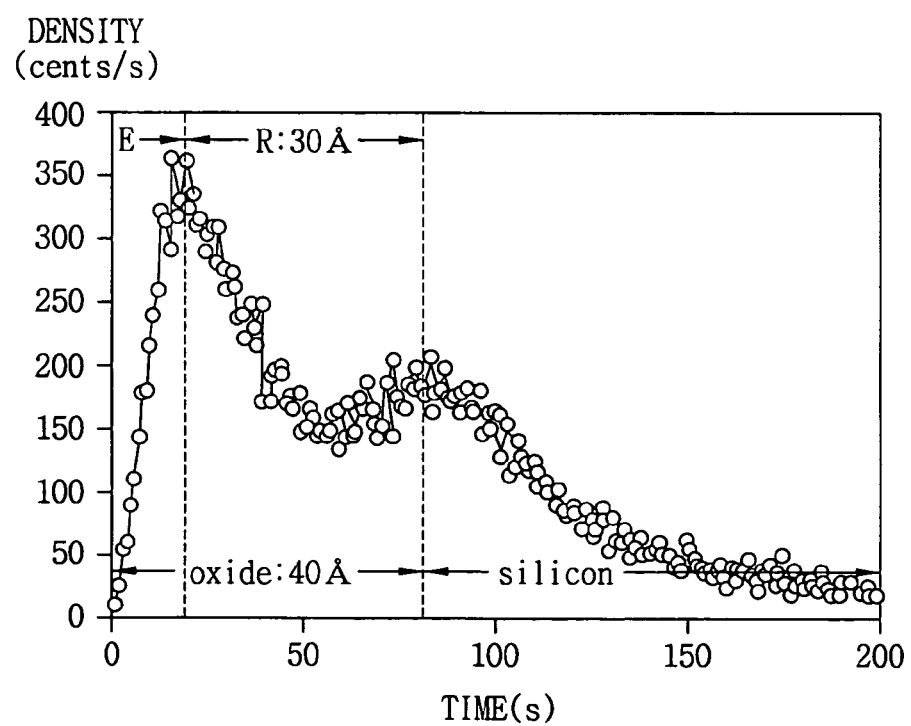
FIG. 4 is a graph showing a profile of a concentration of nitrogen penetrating into the second gate oxide layer as a function of time when a surface of the second gate oxide layer is nitrified in accordance with an embodiment of the present invention.

FIG. 4 shows a profile of a concentration of nitrogen penetrating into the second gate oxide layer as a function of time when a surface of the second gate oxide layer is nitrified in accordance with an embodiment of the present invention.

Referring to FIG. 4, a concentration of nitrogen penetrating into an interface of the substrate and the second gate oxide layer is low, whereas a concentration of nitrogen penetrating into the surface of the oxynitide layer 110 is high.

Figure 2G:
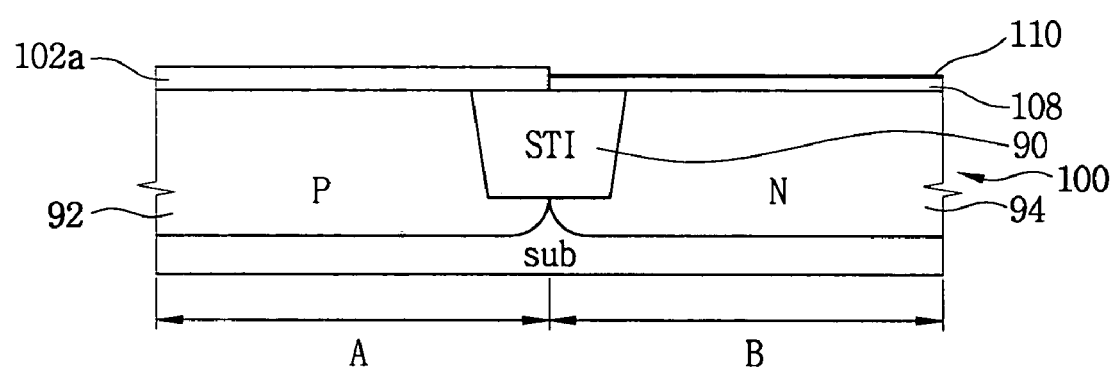

Referring to FIG. 2G, the nitride layer pattern 104a is etched for about one minute using an etchant having a high etching selectivity respect to the oxynitride layer 110 to thereby remove the nitride layer pattern 104a. For example, the etchant may include a phosphoric acid ($H_3PO_4$) and an SCI solution.

As the nitride layer pattern 104a is removed, the first gate oxide layer pattern 102a having a thickness thicker than that of the second gate oxide layer 108 remains in the first region A. A dual layer having the second gate oxide layer 108 and the oxynitride layer 110 remains in the second region B.

The oxynitride layer 110 is positioned only on the second gate oxide layer 108. Accordingly, the oxynitride layer 110 on the second gate oxide layer 108 prevent impurities in a polysilicon layer pattern from flowing (or diffusing) into a channel region of the substrate so that a depletion effect of a ploy gate and a threshold voltage fluctuation may be prevented.

Furthermore, since the oxynitride layer 110 is not positioned on the first gate is oxide layer pattern 102a, a threshold voltage of a semiconductor device is not reduced. Particularly, it is not required to implant additional ions into the channel region of the substrate in order to increase the threshold voltage.

FIGS. 5A to 5D are cross-sectional views illustrating a method of forming gate electrodes including gate oxide layers applied to a complementary metal oxide semiconductor field effect transistor (CMOS-FET) in accordance with an embodiment of the present invention.

Dual gate oxide layers 202 and 208 having different thicknesses are employed in a CMOS-FET The dual gate oxide layers 202 and 208 are formed using the method illustrated with reference to FIGS. 2A to 2G. Therefore, illustrations of the method of forming the dual gate oxide layers are omitted.

Figure 5A:
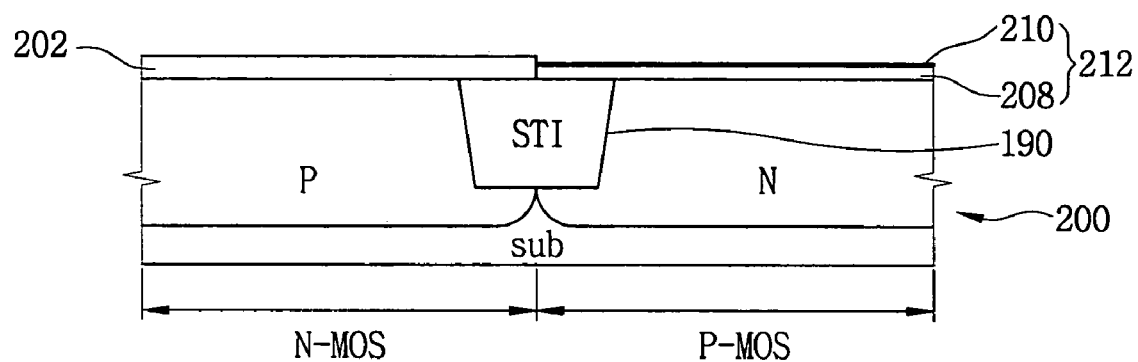
FIGS. 5A to 5D are cross-sectional views illustrating a method of forming gate electrodes including gate oxide layers applied to a complementary metal oxide semiconductor field effect transistor (CMOS-FET) in accordance with an embodiment of the present invention.

Referring to FIG. 5A, a trench structure 190 is formed at an upper portion of a substrate 200 to divide the substrate 200 into an N-type MOS transistor region and a P-type MOS transistor region. A first gate oxide layer 202 having a thickness of about 55 Å to about 65 Å is formed on the N-type MOS transistor region. A dual layer having a thickness of about 45 Å to about 55 Å is formed on the P-type MOS transistor region. The dual layer includes a gate oxide layer 208 and an oxynitride layer 210 formed on the gate oxide layer 208. The oxynitride layer 210 has a thickness of about 10 Å, and the gate oxide layer 208 has a thickness of about 35 Å to about 45 Å.

In the CMOS-FET device, the N-type MOS transistor device region includes a P-type well (not shown), and the P-type MOS transistor device region includes an N-type well (not shown).

Figure 5B:
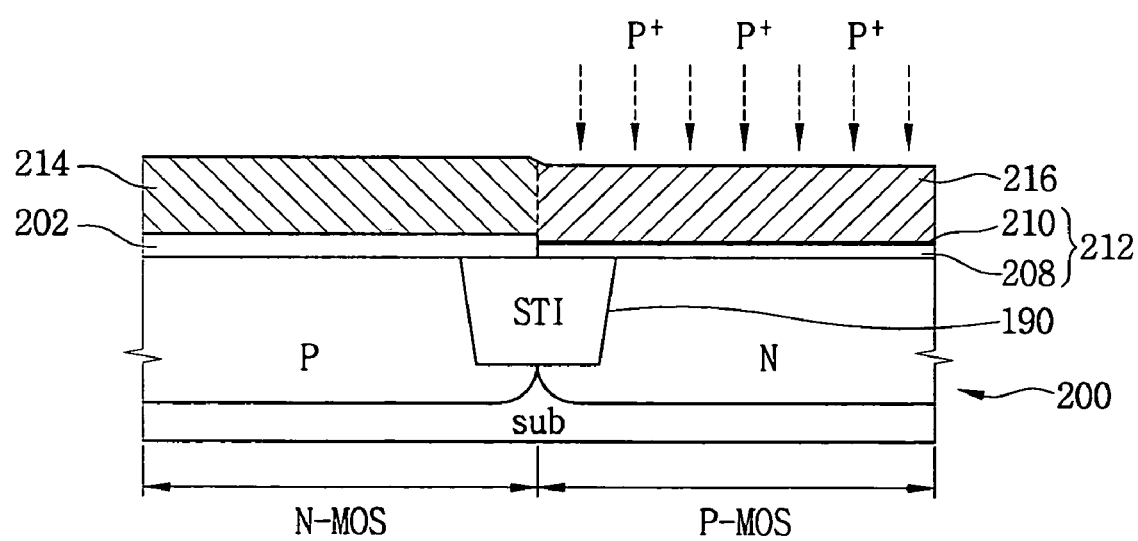

Referring to FIG. 5B, a first polysilicon layer 214 doped with $N^+$ type impurities is formed on the first gate oxide layer 202 in the N-type MOS transistor region. A second polysilicon layer 216 doped with $P^+$ type impurities is formed on the dual layer 212 in the P-type MOS transistor device region.

$N^+$ type impurities are implanted into a polysilicon layer in the N-type MOS transistor device region to form the first polysilicon layer 214. $P^+$ type impurities are implanted into a polysilicon layer in the. P-type MOS transistor region, using an N-type well (not shown) as a mask, to form the second polysilicon layer 216.

An annealing process may be additionally performed on the substrate 200 to activate the impurities implanted into the first polysilicon layer 214 and the second polysilicon layer 216. The oxynitride layer 210 on the surface of the second gate oxide layer 208 is capable of effectively preventing the $P^+$ type impurities implanted into the second polysilicon layer 216 from infiltrating (or diffusing) into a channel region of the substrate through the second gate oxide layer 208.

Figure 5C:
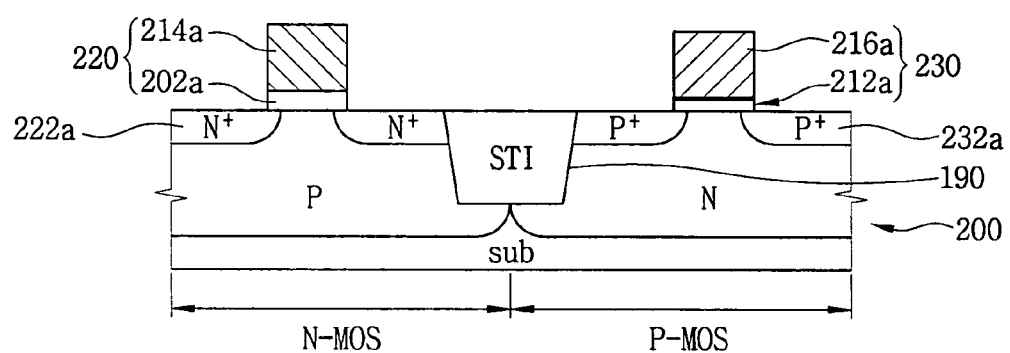

Referring to FIG. 5C, the first and second polysilicon layers 214 and 216 and the first and second gate oxide layers 202 and 208 are subsequently etched using an etching mask (not shown) to form a first gate electrode 220 and a second gate electrode 230.

The first gate electrode 220 includes a first gate oxide layer pattern 202a and a first polysilicon layer pattern 214a formed on the first gate oxide layer pattern 202a. The second gate electrode 230 includes a dual layer pattern 212a including a second gate oxide layer pattern and an oxynitride layer pattern, and a second polysilicon layer pattern 216a formed on the dual layer pattern 212a.

$N^+$ type impurities are then implanted into the N-type MOS transistor deviceregion using the first gate electrode 220 as an ion implanting mask to form a first $N^+$ type source/drain region 222a. $P^+$ type impurities are implanted into the P-type MOS transistor device region using the second gate electrode 230 as an ion implanting mask to form a first $P^+$ type source/drain region 232a.

Figure 5D:
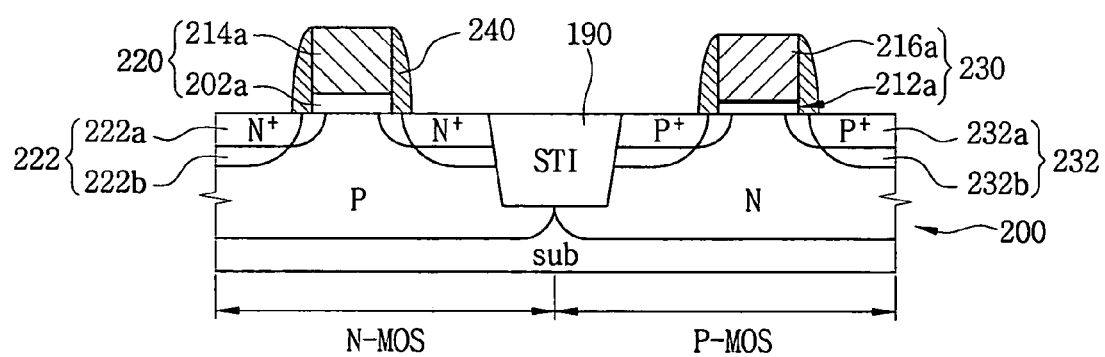

Referring to FIG. 5D, a spacer nitride layer (not shown) having a thickness of about 100 Å is formed on the substrate 200 having the first gate electrode 220 and the second gate electrode 230. The spacer nitride layer is etched back for exposing a surface of the first and second polysilicon layer patterns 214a, and 216a to form gate spacers 240. The gate spacers 240 are formed on sidewalls of the first gate electrode 220 and the second gate electrode 230.

$N^+$ type impurities are then implanted into the first $N^+$ type source/drain region 222a of the substrate 200 using the first gate electrode 220 having the gate spacer 240 as an ion implanting mask to form a second $N^+$ type source/drain region 222b. $P^+$ type impurities are implanted into the first $P^+$ source/drain region 232a using the second gate electrode 230 having the gate spacer 240 as an ion implanting mask to form a second $P^+$ type source/drain region 232b.

The first $N^+$ type source/drain region 222a and the second $N^+$ type source/drain region 222b are overlapped to form $N^+$ type source/drain region 222 having a lightly doped drain (LDD) structure. The first $P^+$ type source/drain region 232a and the second $P^+$ type source/drain region 232b are overlapped to form a $P^+$ type source/drain region 232 having an LDD structure.

FIGS. 6A to 6D are cross-sectional views illustrating a method of forming gate electrodes including gate oxide layers applied to a merged DRAM and logic (MDL) device in accordance with an embodiment of the present invention.

Dual gate oxide layers 302 and 308 having different thicknesses are employed in an MDL device. The dual gate oxide layers 302 and 308 are formed using a method illustrated with reference to FIGS. 2A to 2G, except for an N-type well formed in a first region of the substrate and a P-type well formed in a second region of the substrate. Therefore, illustrations of the method of the dual gate oxide layer are omitted.

Figure 6A:
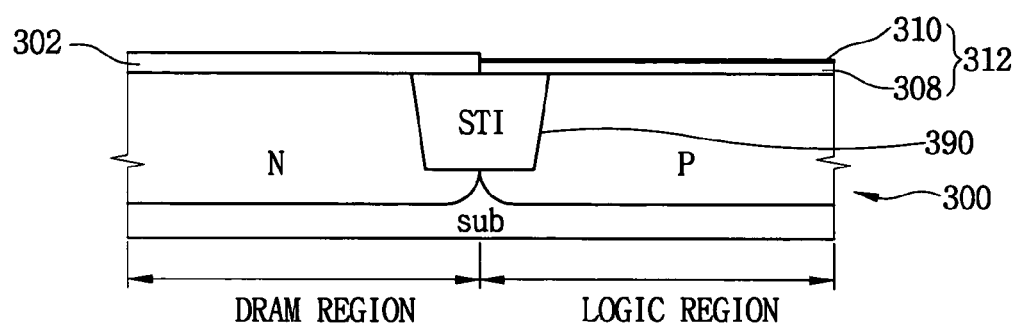
FIGS. 6A to 6D are cross-sectional views illustrating a method of forming gate electrodes including gate oxide layers applied to a merged DRAM and logic (MDL) device in accordance with an embodiment of the present invention.

Referring to FIG. 6A, a trench structure 390 is formed at an upper surface portion of a substrate 300 to divide the substrate 300 into a DRAM device region and a logic device region. A first gate oxide layer 302 having a thickness of about 60±5 Å is formed on the DRAM device region, and a dual layer 312 having a thickness of about 50±5 Å is formed on the logic device region. The dual layer 312 includes a second gate oxide layer 308 and an oxynitride layer 310 formed on the second gate oxide layer 308. The oxynitride layer 310 has a thickness of about 10 Å.

In the MDL device, the DRAM device region includes an N-type well (not shown) and the logic device region includes a P-type well (not shown).

Figure 6B:
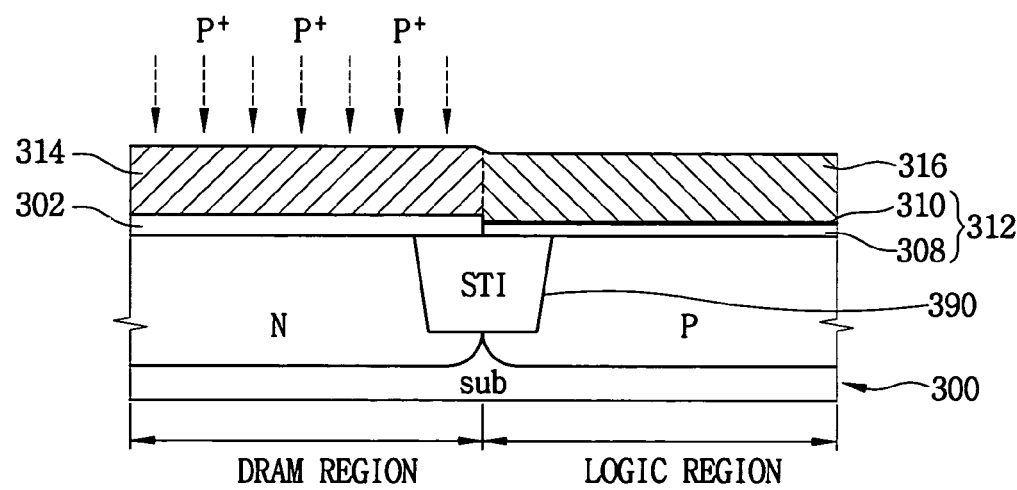

Referring to FIG. 6B, a first polysilicon layer 314 doped with $P^+$ type impurities is formed on the first gate oxide layer 302 in the DRAM device region. A second polysilicon layer 316 doped with $N^+$ type impurities is formed on the dual layer in the logic device region.

$P^+$ type impurities are implanted into a polysilicon layer in the DRAM device region to form the first polysilicon layer 314. $N^+$ type impurities are then implanted into a polysilicon layer in the logic device region using a P-type well (not shown) as an ion implanting mask, to form the second polysilicon layer 316.

An annealing process may be additionally performed on the substrate 300 to activate the impurities implanted into the first polysilicon layer 314 and the second polysilicon layer 316. The oxynitride layer 310 on the surface of the second gate oxide layer 308 may effectively prevent the N+ type impurities implanted into the second polysilicon layer 316 from penetrating into a channel region of the substrate through the second gate oxide layer 308.

Figure 6C:
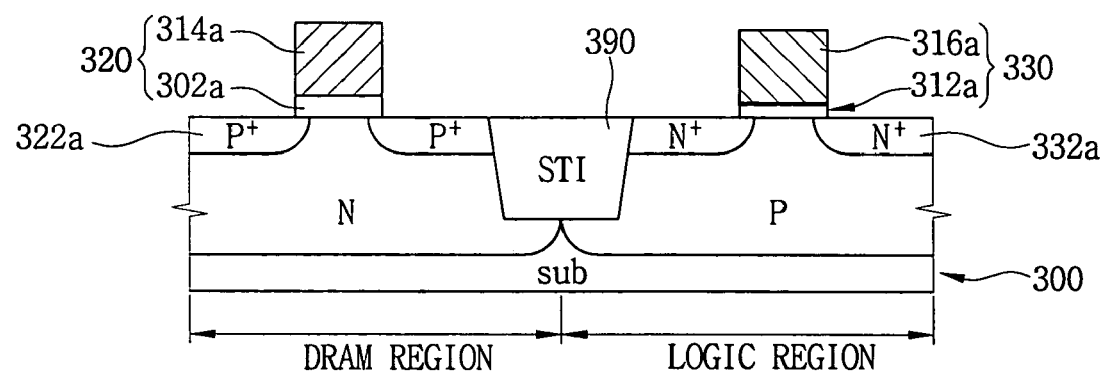

Referring to FIG. 6C, the first and second polysilicon layers 314 and 316 and the first and second gate oxide layers 302, 308 are subsequently etched using an etching mask (not shown) to form a first gate electrode 320 and a second gate electrode 330.

The first gate electrode 320 includes a first gate oxide pattern 302a and a first polysilicon layer pattern 314a formed on the first gate oxide layer pattern 302a. The second gate electrode 330 includes a dual layer pattern 312a having a second gate oxide layer pattern and an oxynitride layer pattern, and a second polysilicon layer pattern 316a formed on the dual layer pattern 312a.

P+ type impurities are then implanted into the DRAM device region of the substrate using the first gate electrode 320 as an ion implanting mask to form a first P+ type source/drain region 322a. N+ type impurities are implanted into the logic device region of the substrate using the second gate electrode 330 as an ion implanting mask to form a first N+ type source/drain region 332a.

Figure 6D:
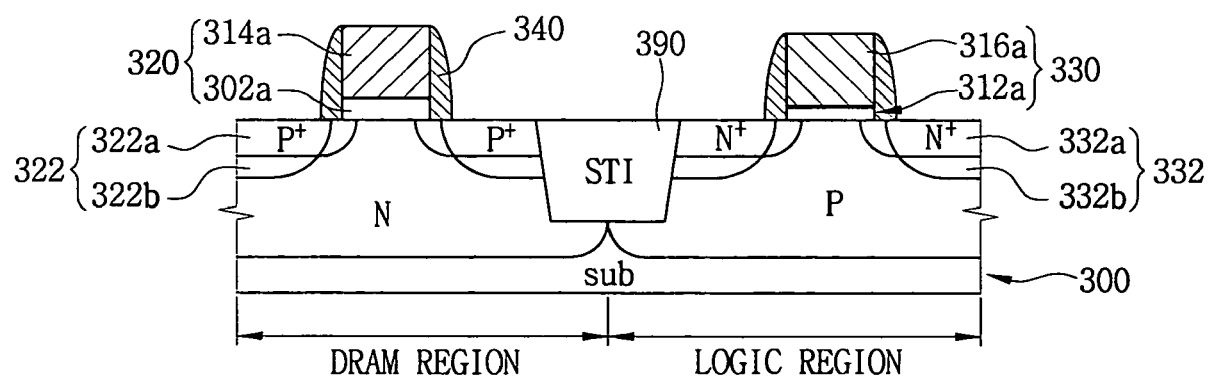

Referring to FIG. 6D, a spacer nitride layer (not shown) having a thickness of about 100 Å is formed on the substrate 300 having the first and second gate electrodes 320 and 330. The spacer nitride layer is etched back for exposing a surface of the first and second polysilicon patterns 314a and 316a to form gate spacers 340. The gate spacers 340 are formed on the sidewalls of the first and second gate electrodes 320 and 330.

P+ type impurities are then implanted into the first P+ type source/drain region 322a of the substrate 300 using the first gate electrode 320 having the gate spacer 340 as an ion implanting mask, thereby forming a second P+ type source/drain region 322b. N+ type impurities are implanted into the first N+ source/drain region 332a using the second gate electrode 330 having the gate spacer 340 as an ion implanting mask, thereby forming a second N+ type source/drain region 332b.

The first P+ type source/drain region 322a and the second P+ type source/drain regions 322 are overlapped to form P+ type source/drain region 322 having a lightly doped drain structure. The first N+ type source/drain region 332a and the second N+ type source/drain region 332b are overlapped to form N+ type source/drain region 332 having the LDD structure.

As described above, since the oxynitride layer is formed on a thin gate oxide of the second electrode, impurities implanted into the polysilicon layer of the second gate electrode do not penetrate into the channel region of the substrate through the second oxide layer, thereby effectively reducing a depletion effect of a poly gate and a threshold voltage fluctuation.

Further, since the oxynitride layer is not formed on the first gate oxide layer having the first thickness, an additional ion implantation process performed on the channel region for increasing a threshold voltage of a semiconductor device is not needed.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of forming gate oxide layers of a semiconductor device comprising:
    forming a first gate oxide layer having a first thickness on a substrate;
    forming a nitride layer pattern on the first gate oxide layer;
    etching the first gate oxide layer using the nitride layer pattern as an etching mask for forming a first gate oxide layer pattern and exposing a surface of the substrate;
    forming a second gate oxide layer having a second thickness on the exposed surface of the substrate;
    nitrifying a surface of the second gate oxide layer to form an oxynitride layer on the second gate oxide layer; and
    removing the nitride layer pattern using an etchant having a high selectivity with respect to the oxynitride layer after forming the oxynitride layer.

2. The method of claim 1, wherein the substrate is divided into a first region and a second region, wherein the first region includes one of an N-type metal oxide semiconductor transistor region, a high voltage region or a dynamic random access memory device region, and the second region includes one of a P-type metal oxide semiconductor transistor region, a low voltage region, or a logic region.

3. The method of claim 2, wherein the first gate oxide layer pattern is located in the first region, the second gate oxide layer is located in the second region, and the first gate oxide layer pattern has a thickness greater than that of the second oxide layer.

4. The method of claim 2, wherein the dynamic random access memory device region and the logic region are part of a merged dynamic random access memory and logic device.

5. The method of claim 1, wherein forming the nitride layer pattern comprises:
    annealing the first gate oxide layer;
    forming a nitride layer on the annealed first gate oxide layer;
    annealing the nitride layer;
    forming a photoresist pattern on the annealed nitride layer; and
    etching the annealed nitride layer using the photoresist pattern as an etching mask to form the nitride layer pattern.

6. The method of claim 5, wherein the nitride layer is formed at a temperature of below about 600° C. by a low pressure chemical vapor deposition process.

7. The method of claim 5, wherein the first gate oxide layer and the nitride layer are annealed at a temperature of about 730° C. to about 950° C. under an inactive gas atmosphere.

8. The method of claim 5, wherein the density of the nitride layer is increased.

9. The method of claim 1, wherein the oxynitride layer is formed by implanting at least one of ions of nitrogen or radicals of ammonia into the surface of the second gate oxide layer after the substrate including the second gate oxide layer is heated to a temperature of about 380° C. to about 450° C.

10. A method for forming a gate electrode of a semiconductor device comprising:
    forming a first gate oxide layer on a substrate divided into a first region and a second region;
    forming a nitride layer pattern on the first gate oxide layer in the first region;

etching the first gate oxide layer using the nitride layer pattern as an etching mask to form a first gate oxide layer pattern in the first region;

forming a second gate oxide layer in the second region;

nitrifying a surface of the second gate oxide layer to form an oxynitride layer on the second gate oxide layer;

removing the nitride layer pattern using an etchant having a high selectivity with respect to the oxynitride layer after forming the oxynitride layer;

forming a polysilicon layer on the first gate oxide layer pattern and the oxynitride layer; and etching the first gate oxide layer pattern, the second gate oxide layer, the oxynitride layer and the polysilicon layer to form a first gate electrode in the first region and a second gate electrode in the second region.

11. The method of claim 10, wherein the first region includes one of an N-type metal oxide semiconductor transistor region, a high voltage region, or a dynamic random access memory device region and the second region includes one of a P-type metal oxide semiconductor transistor region, a low voltage region, or a logic region.

12. The method of claim 11, wherein the dynamic random access memory device region and the logic region are part of a merged dynamic random access memory and logic device.

13. The method of claim 10, wherein the first gate oxide layer pattern has a thickness greater than that of the second gate oxide layer.

14. The method of claim 10, wherein forming the nitride layer pattern comprises:
annealing the first gate oxide layer;
forming a nitride layer on the annealed first gate oxide layer;
annealing the nitride layer;
forming a photoresist pattern on the annealed nitride layer; and
etching the annealed nitride layer using the photoresist pattern as an etching mask to form the nitride layer pattern.

15. The method of claim 14, wherein the nitride layer is formed at a temperature of below about 600° C. by a low pressure chemical vapor deposition process.

16. The method of claim 14, wherein the first gate oxide layer and the nitride layer are annealed at a temperature of about 730° C. to about 950° C. under an inactive gas atmosphere.

17. The method of claim 14, wherein the density of the nitride layer is increased.

18. The method of claim 10, wherein the oxynitride layer is formed by implanting at least one of ions of nitrogen or radicals of ammonia into the surface of the second gate oxide layer after the substrate having the second gate oxide layer is heated to a temperature of about 380° C. to about 450° C.

19. The method of claim 10, wherein first impurities are implanted into the polysilicon layer in the first region, and second impurities are implanted into the polysilicon layer in the second region.

20. The method of claim 10, further comprising:
implanting ions into a surface of the substrate having the first and second gate electrodes to form a first source/drain region and a second source/drain region.

21. A method of forming gate oxide layers of a semiconductor device comprising:
forming a first gate oxide layer having a first thickness on a substrate;
forming a nitride layer pattern on the first gate oxide layer;
etching the first gate oxide layer using the nitride layer pattern as an etching mask for forming a first gate oxide layer pattern and exposing a surface of the substrate;
forming a second gate oxide layer having a second thickness on the exposed surface of the substrate;
nitrifying a surface of the second gate oxide layer to form an oxynitride layer on the second gate oxide layer; and
removing the nitride layer pattern after forming the oxynitride layer.

* * * * *